(12) United States Patent
Eryu et al.

(10) Patent No.: US 8,716,678 B2
(45) Date of Patent: May 6, 2014

(54) METHOD OF MANUFACTURING MICROSTRUCTURE AND SUBSTRATE PROVIDED WITH THE MICROSTRUCTURE

(75) Inventors: Osamu Eryu, Nagoya (JP); Takatoshi Kinoshita, Nagoya (JP); Kenji Kawata, Inuyama (JP); Kazutoshi Hotta, Ichinomiya (JP)

(73) Assignee: Fujimi Incorporated, Kiyosu-shi (JP)

( * ) Notice: Subject to any disclaimer, the term of this patent is extended or adjusted under 35 U.S.C. 154(b) by 395 days.

(21) Appl. No.: 12/867,212

(22) PCT Filed: Feb. 16, 2009

(86) PCT No.: PCT/JP2009/052495
§ 371 (c)(1),
(2), (4) Date: Oct. 6, 2010

(87) PCT Pub. No.: WO2009/104537
PCT Pub. Date: Aug. 27, 2009

(65) Prior Publication Data
US 2011/0052870 A1 Mar. 3, 2011

(30) Foreign Application Priority Data

Feb. 18, 2008 (JP) .................................. 2008-035844
Feb. 18, 2008 (JP) .................................. 2008-035845

(51) Int. Cl.
*G21G 5/00* (2006.01)
(52) U.S. Cl.
USPC .................... 250/492.1; 250/492.2; 250/492.3
(58) Field of Classification Search
CPC ............ H01L 21/0262; B81C 1/00111; B82B 3/0038
USPC ............. 250/492.1–492.3; 977/843, 890, 762
See application file for complete search history.

(56) References Cited

U.S. PATENT DOCUMENTS

| 8,343,366 | B2* | 1/2013 | Hong et al. ...................... 216/41 |
| 2003/0008505 | A1 | 1/2003 | Chen et al. |
| 2003/0012050 | A1* | 1/2003 | Iwasaki ......................... 365/171 |
| 2006/0089489 | A1 | 4/2006 | Onizuka et al. |
| 2006/0145182 | A1 | 7/2006 | Fujioka et al. |

(Continued)

FOREIGN PATENT DOCUMENTS

| CN | 1823400 | 8/2006 |
| CN | 1956229 A | 5/2007 |

(Continued)

OTHER PUBLICATIONS

PCT International Preliminary Report on Patentability: International Application PCT/JP2009/052495: International Filing Date, Feb. 16, 2009. Document contains relevancy of the attached prior art.

*Primary Examiner* — Michael Maskell
(74) *Attorney, Agent, or Firm* — Vidas, Arrett & Steinkraus, P.A.

(57) ABSTRACT

A method is provided for manufacturing a microstructure on a substrate in which the substrate has thereon linear and parallel atomic steps. The microstructure includes linear elements that extend along the atomic steps. The method includes a step for preparing a substrate having atomic steps on its surface and a step for applying linear elements onto the substrate. Each linear element is oriented to extend along one of the atomic steps, with the result that a microstructure in which the linear elements extend along the atomic steps is formed on the substrate. The substrate can be prepared by subjecting a silicon carbide substrate, a sapphire substrate, or a zinc oxide substrate to an ultrasmoothing process. As the linear elements, peptide fibers can be employed that are made up of peptide molecules that form β-sheet structures.

13 Claims, 4 Drawing Sheets

(56) References Cited

U.S. PATENT DOCUMENTS

| | | | |
|---|---|---|---|
| 2007/0253889 A1* | 11/2007 | Awano et al. | 423/447.3 |
| 2008/0206936 A1* | 8/2008 | Fernandez-Ceballos et al. | 438/151 |

FOREIGN PATENT DOCUMENTS

| | | |
|---|---|---|
| JP | 10083962 A | 3/1998 |
| JP | 2003-155365 | 5/2003 |
| JP | 2005125428 A | 5/2005 |
| JP | 2005203433 A | 7/2005 |
| JP | 2006-117602 A | 5/2006 |
| JP | 2007217375 A | 8/2007 |
| WO | 2006/125825 A2 | 11/2006 |
| WO | 2007000979 A1 | 1/2007 |

\* cited by examiner

METHOD OF MANUFACTURING MICROSTRUCTURE AND SUBSTRATE PROVIDED WITH THE MICROSTRUCTURE

CROSS-REFERENCE TO RELATED APPLICATIONS

Not applicable.

STATEMENT REGARDING FEDERALLY SPONSORED RESEARCH

Not applicable.

BACKGROUND OF THE INVENTION

The present invention relates to a method for manufacturing, on the surface of a substrate having atomic steps, especially parallel and linear atomic steps, a microstructure of linear elements that extend along the atomic steps, and to a substrate having such a microstructure. The present invention also relates to a method for manufacturing a microstructure including protrusion lines on the surface of a substrate and to a substrate having such a microstructure.

Conventionally, techniques for making an ordered microstructure on a substrate have been known, in which an ordered microstructure is fabricated by regularly arranging fine substances such as polypeptides on a substrate by means of a method such as the Langmuir-Blodgett technique (LB technique for short) (see, for example, Patent Document 1). An ordered microstructure fabricated on a substrate is used, for example, as a mold. Specifically, the ordered microstructure is used to form its negative copy on a physically stable material such as the substrate. The negative copy is applicable to various industries. Therefore, the ordered microstructure has a high industrial applicability.

However, in a case where an ordered microstructure is formed by a conventional technique, an area in which fine substances are regularly arranged is often limited to a small part on the substrate. That is, according to the conventional technique, it is difficult to obtain a large area ordered microstructure in a highly reproducible manner. Accordingly, if an ordered microstructure formed on a substrate is used to form its negative copy on the substrate, the negative copy of the ordered microstructure cannot be formed to have a large area in a highly reproducible manner.

Patent Document 1: Japanese Laid-Open Patent Publication No. 2005-203433

DETAILED DESCRIPTION OF THE INVENTION

Accordingly, it is an objective of the present invention to provide a method for manufacturing on a substrate a microstructure of linear elements that extend precisely in a predetermined direction, and a substrate having such a microstructure. It is another objective of the present invention to provide a method for manufacturing on the surface of a substrate a microstructure including protrusion lines that extend precisely in a predetermined direction, and a substrate having such a microstructure.

To achieve the above objective and in accordance with a first aspect of the present invention, a method for manufacturing a microstructure on a substrate is provided. The method includes: preparing a substrate having atomic steps on its surface; and applying linear elements onto the substrate such that each linear element is oriented to extend along one of the atomic steps on the substrate surface, with the result that a microstructure in which the linear elements extend along the atomic steps is formed on the substrate.

In accordance with a second aspect of the present invention, a substrate is provides that includes atomic steps on its surface. A microstructure formed by linear elements extending along the atomic steps is provided on the substrate.

In accordance with a third aspect of the present invention, a method for manufacturing a microstructure on a surface of a substrate is provided. The method includes: preparing a substrate having atomic steps on its surface; applying linear elements onto the substrate such that each linear element is oriented to extend along one of the atomic steps on the substrate surface; performing ion irradiation of the substrate, on which the linear elements are oriented, thereby generating a lattice defect layer on the surface of the substrate, wherein the thickness of the lattice defect layer generated by the ion irradiation is less in a first portion of the substrate surface that is masked by the linear elements than in a second portion of the substrate surface that is not masked by the linear elements; and polishing the substrate surface after the ion irradiation to remove the lattice defect layer generated on the substrate surface through the ion irradiation, wherein, due to the difference in the thickness of the lattice defect layer between the first portion and the second portion of the substrate surface, a microstructure of protrusion lines corresponding to the first portion and recess lines corresponding to the second portion is formed on the substrate surface after the polishing.

In accordance with a fourth aspect of the present invention, a substrate is provided that includes protrusion lines provided on its surface. The width of the protrusion lines is 2 to 20 nm, and the protrusion lines are repetitively formed over the entirety of a square area each side of which is at least 1 μm long.

DETAILED DESCRIPTION OF THE INVENTION

While this invention may be embodied in many different forms, there are described in detail herein a specific preferred embodiment of the invention. This description is an exemplification of the principles of the invention and is not intended to limit the invention to the particular embodiment illustrated One embodiment of the present invention will now be described.

In the present embodiment, unit elements are provided on a substrate. The unit elements are associated with each other to form linear elements. Typical examples of the unit elements used here include peptide molecules capable of forming β-sheet structures. As long as they are capable of forming β-sheet structures, the peptide molecules are not particularly limited based on the content of the amino-acid sequence, the number of amino-acid residues, or the type of amino-acid side chains. In a β-sheet structure, an adjacent pair of peptide molecules are bonded together to be parallel or antiparallel to each other by a hydrogen bond between the hydrogen atom in the N—H group of the main chain of one of the peptide molecules and the oxygen atom in the C=O group of the main chain of the other peptide molecule.

Figure 1:
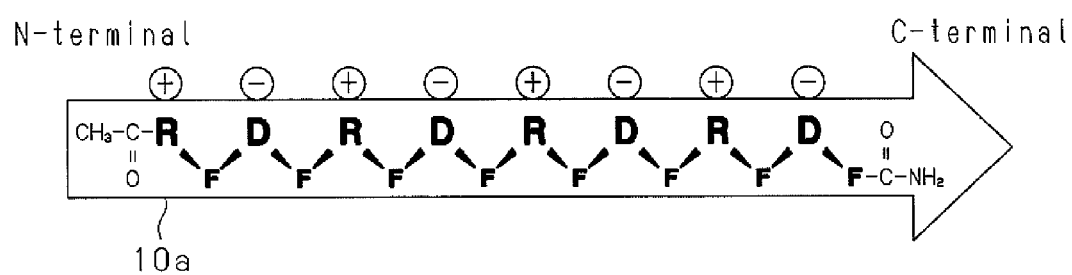
FIG. 1 is a diagram of one of peptide molecules as a preferred example of unit elements according to one embodiment of the present invention.

Although not intended to limit the scope of the invention, the peptide molecule denoted by numeral 10a in FIG. 1 is a peptide molecule that can be favorably used in the present embodiment. As shown in FIG. 1, the peptide molecule 10a is expressed by the chemical formula: $CH_3CO$-(Arg-Phe-Asp-Phe)$_4$-$CONH_2$. In the main chain of the peptide molecule 10a, hydrophilic amino acids (arginine and aspartic acid) and hydrophobic amino acids (phenylalanine) alternately appear. Any peptide molecule having this type of amino acid sequence preferentially forms β-sheet structures. Thus, a peptide molecule that can be suitably used in the present invention is not limited to the peptide molecule 10a, as long as peptide molecules have such an amino acid sequence. The peptide molecule 10a of FIG. 1 is about 5.5 nm long and 1 nm or less in diameter.

Figure 2:
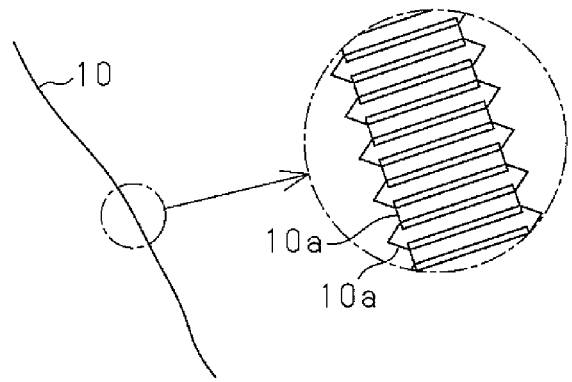
FIG. 2 is a diagram of one of peptide fibers obtained when the peptide molecules shown in FIG. 1 form anti-parallel β-sheet structures.

FIG. 2 shows one of peptide fibers 10 obtained when the peptide molecules 10a of FIG. 1 form β-sheet structures. As shown in FIG. 2, adjacent peptide molecules 10a in the peptide fiber 10 are antiparallel to each other. The peptide fiber 10 is formed by arranging, in antiparallel, peptide molecules each having an amino group, which is a polar group, at the C-terminus. The peptide fiber 10 therefore has a uniform polarity.

A substrate used in the present embodiment has atomic steps on the surface. The substrate preferably has linear atomic steps that are parallel to each other on the surface. The use of a substrate having atomic steps on its surface is indispensable for precisely arranging peptide molecules forming β-sheet structures, that is, peptide fibers serving as linear elements, along a specific direction on the substrate. At least one of the reasons is that the edge of each atomic step on the substrate surface has a high dangling-bond density.

Figure 3A:
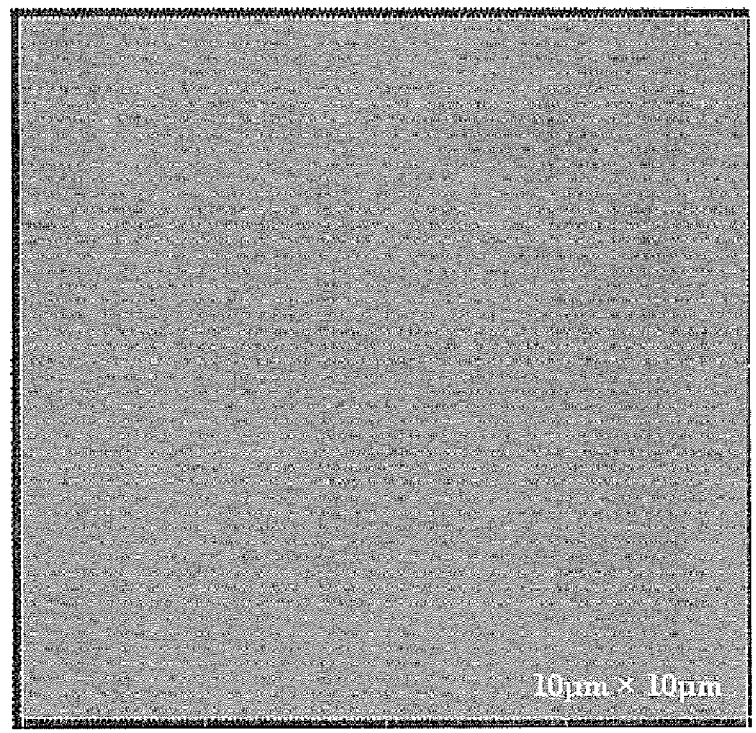
FIG. 3A is an atomic force microscopic image of the Si-face of a silicon carbide substrate that has been subjected to an ultrasmoothing process.
Figure 3B:
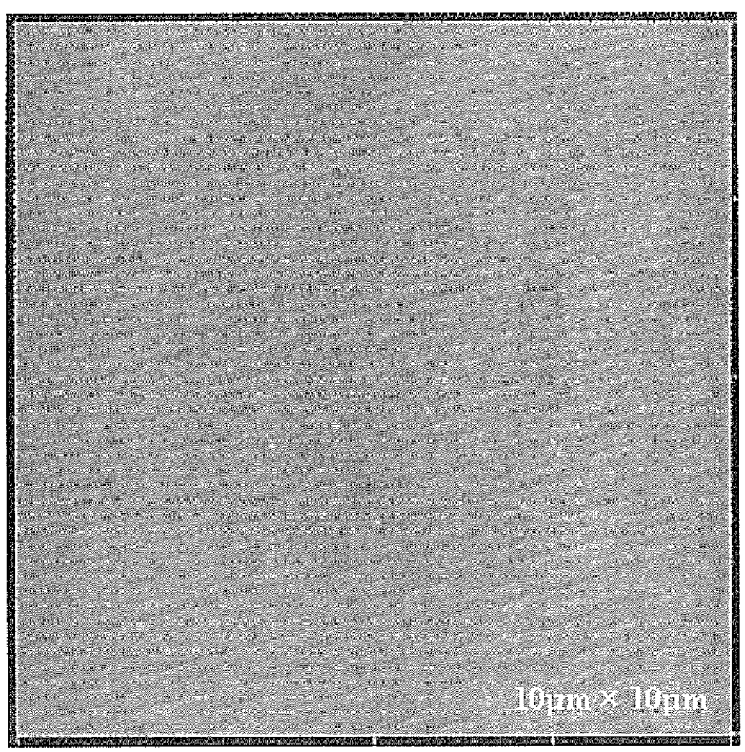
FIG. 3B is an atomic force microscopic image of the C-face of a silicon carbide substrate that has been subjected to an ultrasmoothing process.

Typical examples of the substrate used in the present embodiment include a silicon carbide substrate that has been subjected to an ultrasmoothing process, a sapphire substrate that has been subjected to an ultrasmoothing process, and a zinc oxide substrate that has been subjected to an ultrasmoothing process. On the surface of these substrates, parallel and linear atomic steps at intervals of several tens of nanometers to several hundreds of nanometers are observed. Typical methods of ultrasmoothing process for obtaining atomic steps on the surface of a substrate include polishing. For example, a substrate that is suitable for the present embodiment can be obtained by polishing the surface of a silicon carbide substrate using colloidal silica. As an example, FIGS. 3A and 3B show the Si-face and the C-face of a silicon carbide substrate, which has been subjected to an ultrasmoothing process through buffing with colloidal silica slurry. The drawings clearly show that the Si-face and the C-face of the silicon carbide substrate each have linear atomic steps that are parallel to each other. In the example shown in FIGS. 3A and 3B, colloidal silica slurry containing 30% by mass of colloidal silica having an average particle size of 0.1 µm and the remainder of water is adjusted to be pH8 before being used.

Typical method for applying peptide molecules onto a substrate includes the Langmuir-Blodgett technique (LB technique for short). When applying peptide molecules onto a substrate by the LB technique, peptide molecules are first spread and suspended on the liquid surface of water or organic liquid, so as to form a peptide monomolecular film on the liquid surface. On the liquid surface of water or organic liquid, the peptide molecules are bonded to each other to be parallel or antiparallel to each other by intermolecular hydrogen binding, so as to form β-sheet structures. Thereafter, a substrate is passed perpendicularly through the liquid surface of water or organic liquid, so that the peptide molecules having β-sheet structures on the liquid surface of water or organic liquid, or peptide fibers, are transferred onto the substrate surface. At this time, since dangling bonds densely exist at the edges of the atomic steps on the substrate surface, some of the peptide fibers are oriented along the atomic steps on the substrate surface. The remaining peptide fibers are each physically influenced at both ends by a corresponding adjacent pair of the peptide fibers extending along atomic steps, so as to be oriented to be parallel to the pair. In this manner, a microstructure formed by peptide fibers extending along the atomic steps, more particularly, a microstructure formed by the peptide fibers arranged parallel to each other is formed on the substrate.

When the peptide fibers are oriented along the atomic steps on the substrate surface, the polarity of each edge of the atomic steps cooperates with the dangling bonds at the edge of the atomic step. That is, when a polarity exists at each edge of the atomic steps on the substrate surface, the Coulomb force between the edge of the atomic step and the polar group of the C-terminus or the N-terminus of the peptide molecules forming the peptide fibers also functions to orient the peptide fibers along the atomic steps on the substrate surface. In this respect, the peptide fibers used each preferably have a uniform polarity as the peptide fiber 10 shown in FIG. 2.

When water is used as the liquid for spreading and suspending peptide molecules using the LB technique, the hydrophilic amino acids in the main chains of the peptide molecules face the water surface, and the hydrophobic amino acids in the main chains of the peptide molecules face the atmosphere. In this respect, the peptide molecule 10a shown in FIG. 1, which includes the main chain in which hydrophilic amino acids and hydrophobic amino acids are alternately arranged, is advantageous because it is capable of efficiently form a peptide monomolecular film on the water surface. When performing the LB technique using the peptide molecules 10a of FIG. 1, it is advantageous that the peptide molecules 10a include phenylalanine, which has particularly high hydrophobicity, as the hydrophobic amino acids. This is because when a peptide monomolecular film is formed on the water surface in the LB technique, it is important that peptide molecules are reliably suspended on the water surface, that is, located at the interface between the atmosphere and the water. Hydrophobic amino acids that have particularly high hydrophobicity include leucine other than phenylalanine.

Figure 4:
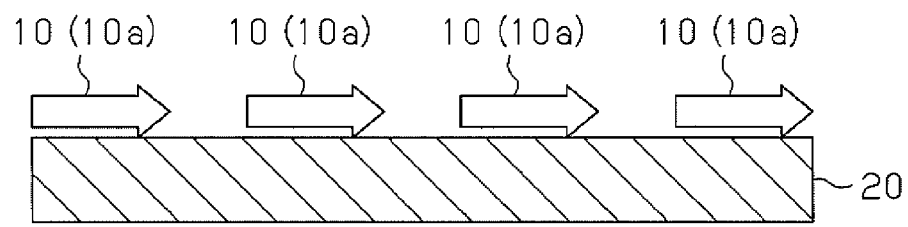
FIG. 4 is a schematic cross-sectional view showing a silicon carbide substrate having on its C-face a microstructure formed by the peptide fibers shown in FIG. 2.
Figure 5:
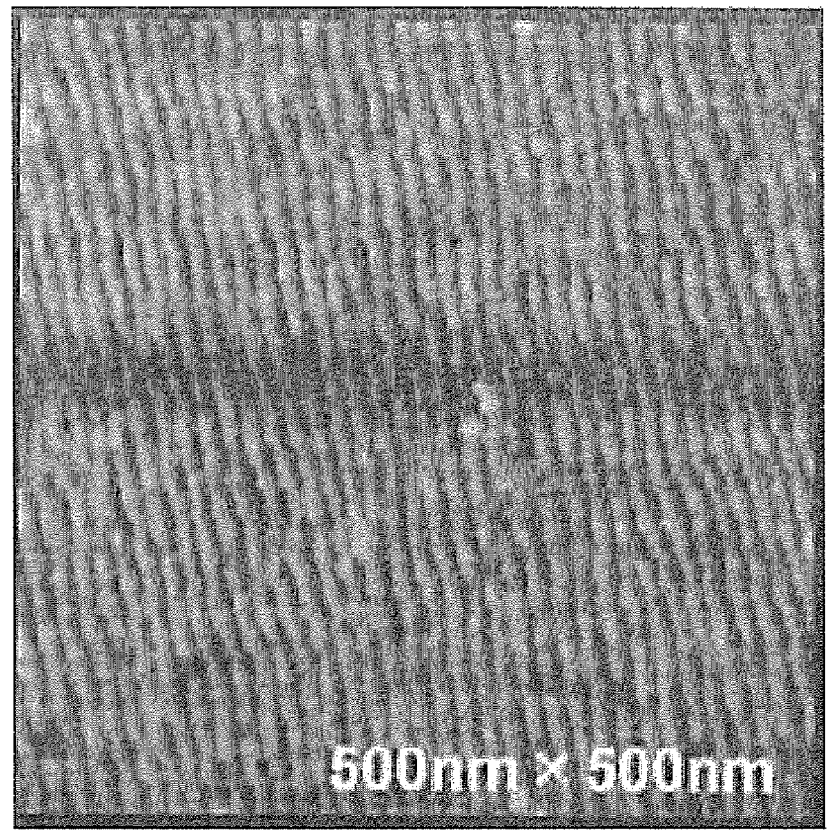
FIG. 5 is an atomic force microscopic image of the silicon carbide substrate shown in FIG. 4 as viewed from the C face.

For example, when the peptide molecules 10a of FIG. 1 are applied to the C-face of the silicon carbide substrate by means of the LB technique or other technique, some of the peptide fibers 10 formed by the peptide molecules 10a are oriented to extend along the atomic steps on the C-face of the silicon carbide substrate. This orientation is achieved not only by the dangling bonds densely provided at the edges of the atomic steps on the C-face, but also by the fact that negatively-charged carbon atoms located on the outermost surface of the C-face, particularly, the negatively-charged carbon atoms at the edges of the atomic steps on the C-face, and the amino groups, which are polar groups, at the C-terminus of the peptide molecules 10*a* are attracted to each other based on Coulomb force. The peptide fibers 10, which are obtained when the peptide molecules 10*a* of FIG. 1 are applied to the C-face of the silicon carbide substrate, form a microstructure. FIG. 4 is a diagrammatic cross-sectional view of the silicon carbide substrate having a C-face on which the microstructure is provided. FIG. 5 is an atomic force microscopic image of the silicon carbide substrate as viewed from the C-face. Numeral 20 in FIG. 4 denotes the silicon carbide substrate. FIG. 5 shows a microstructure in which stripes having a width of about 5 nm are arranged to be substantially parallel in an orderly fashion. The width of about 5 nm is substantially equal to the diameter of the peptide fiber 10 (the length of the peptide molecule 10*a*). The microstructure is formed at least in a square area on the silicon carbide substrate, each side of which area is 500 nm long. It is possible to form the microstructure substantially over the entire surface of the silicon carbide substrate.

Figure 6:
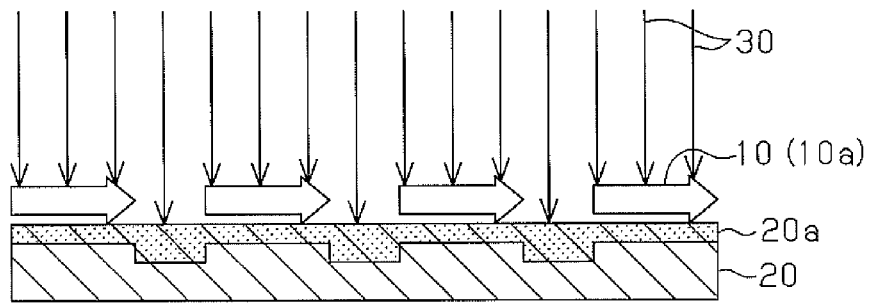
FIG. 6 is a schematic cross-sectional view showing ion irradiation onto the silicon carbide substrate shown in FIG. 4.

In the present embodiment, ion irradiation is performed onto the substrate, on which the peptide fibers are arranged. The ion irradiation onto the substrate surface implants ions into the substrate surface. This creates a lattice defect layer on the substrate surface. At this time, parts of the substrate surface are masked by the peptide fibers. The parts that are not masked by the peptide fibers are referred to as non-masked parts. The lattice defect layer has a smaller thickness in the masked parts than in the non-masked parts. Specifically, ions applied to the non-masked parts directly reach the non-masked parts, whereas ions applied to the masked parts pass through the peptide fibers before reaching the masked parts. The rate of ion implantation to the masked parts is therefore lower than that to the non-masked parts. This causes the difference in the thickness of the lattice defect layer. Typical examples of ions applied onto the substrate include argon ions, neon ions, and nitrogen ions. The ion irradiation conditions such as the intensity of ions and irradiation time should be set in accordance with the types of the substrate and peptide fibers used, and the desired thickness of the lattice defect layer. FIG. 6 is shows ion irradiation onto the silicon carbide substrate of FIG. 4. In FIG. 6, numeral 20*a* denotes a lattice defect layer, and numeral 30 denotes irradiation ions.

Figure 7:
FIG. 7 is a schematic cross-sectional view of the silicon carbide substrate shown in FIG. 4 after the substrate is subjected to ion irradiation and then a lattice defect layer is removed from the C-face through polishing.
Figure 8:
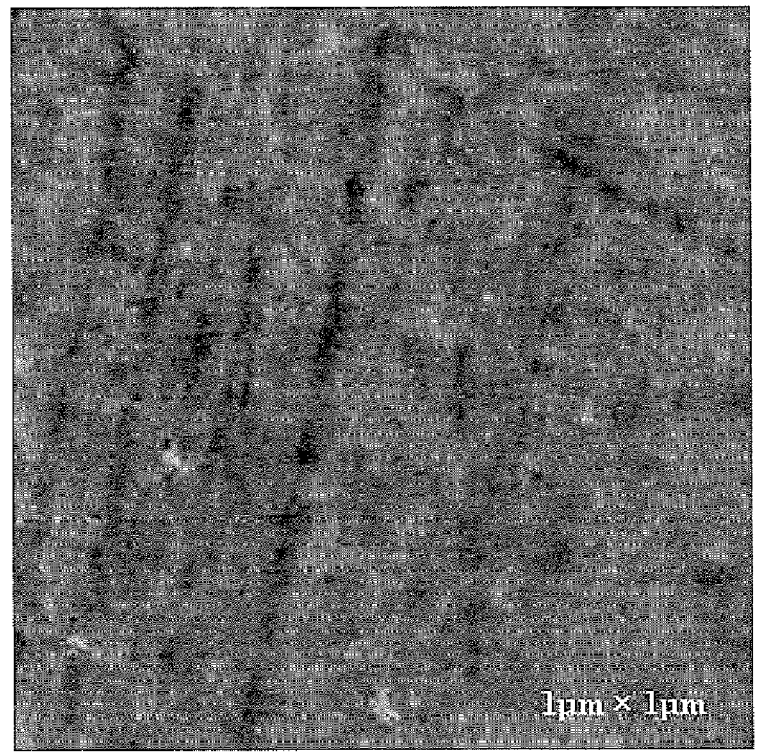
FIG. 8 is an atomic force microscopic image of the C-face of the silicon carbide substrate shown in FIG. 7 after being polished.

In the present embodiment, the substrate surface is polished after the ion irradiation, so as to remove the peptide fibers on the substrate and the lattice defect layer on the substrate surface. As a result, protrusion lines corresponding to the masked parts and recess lines corresponding to the non-masked parts form a microstructure on the substrate surface after polishing. As long as the lattice defect layer is preferentially removed relative to the other parts, the method for polishing the substrate after the ion irradiation is not particularly limited. For example, in a case where the silicon carbide substrate is polished, it is preferable to use colloidal silica. FIG. 7 is a schematic cross-sectional view of the silicon carbide substrate of FIG. 4 after the ion irradiation is performed and then the lattice defect layer of the C-face is removed through polishing by buffing with colloidal silica slurry. FIG. 8 is an atomic force microscopic image of the C-face of the same silicon carbide substrate after the polishing. FIG. 8 shows a microstructure in which protrusion lines having a width of about 5 nm are arranged to be substantially parallel. The width of about 5 nm is substantially equal to the diameter of the peptide fiber 10 (the length of the peptide molecule 10*a*). The microstructure is formed at least in a square area on the silicon carbide substrate surface, each side of which area is 1 μm long. It is possible to form the microstructure substantially over the entire surface of the silicon carbide substrate. In the example shown in FIG. 8, colloidal silica slurry containing 30% by mass of colloidal silica having an average particle size of 0.1 μm and the remainder of water is adjusted to be pH8 before being used.

The above described embodiment may be modified as follows.

When applying peptide molecules to a substrate, a binder such as polyethylene glycol, polyvinylpyrrolidone, or gelatin may be applied onto the substrate together with peptide molecules in order to bind peptide fibers to each other. In this case, the peptide fibers are stably arranged to be parallel to each other on the substrate even under a normal gravitational field. However, under a microgravity field, it is possible to stably arrange peptide fibers on the substrate, so as to be parallel to each other without binders.

The density of the binder used in this modification is generally sufficiently small compared to that of the peptide fibers. Therefore, compared to parts of the substrate surface on which the binder exists between adjacent peptide fibers, the thickness of the lattice defect layer generated by ion radiation is small in parts of the substrate surface that are masked by the peptide fibers. Thus, even if the binder is used, a lattice defect layer similar to that in the above illustrated embodiment is formed on the substrate surface by ion irradiation.

Instead of applying peptide molecules on the substrate, peptide fibers to be arranged on the substrate may directly be applied to the substrate. In this case also, an appropriate binder such as polyethylene glycol may be applied to the substrate together with the peptide fibers.

Alternatively, to arrange linear elements other than peptide fibers on a substrate, linear elements other than peptide fibers may directly be applied to the substrate. Further, unit elements that will be associated with each other to form linear elements may be applied to the substrate. In these cases also, an appropriate binder such as polyethylene glycol may be simultaneously applied to the substrate. Substances that can be used as unit elements include self-assembling substances other than peptide molecules, such as protein substances, deoxyribonucleic acids (DNA), viruses, and amphiphilic block copolymers. In the above illustrated embodiment, where peptide molecules are used, it is possible to form a microstructure having repetitive stripes or protrusion lines the width of which is 3 to 20 nm, in accordance with the number of amino-acid residues of the peptide molecules. In contrast, when protein substances, DNA, or viruses are used, it is possible to form a microstructure having repetitive stripes or protrusion lines the width of which is 2 to 10 nm. When amphiphilic block copolymers are used, it is possible to form a microstructure having repetitive stripes or protrusion lines the width of which is 3 to 20 nm.

Prior to the polishing, the peptide fibers on the substrate after ion irradiation may be removed by a method other than polishing. Specifically, the peptide fibers may be chemically burned off with chemical solution such as alcohol or sulfur acid or may be removed by laser ablation technique.

This completes the description of the preferred and alternate embodiments of the invention. Those skilled in the art may recognize other equivalents to the specific embodiment described herein which equivalents are intended to be encompassed by the claims attached hereto.

The invention claimed is:

1. A method for manufacturing a microstructure on a substrate, the method comprising:
preparing a substrate having atomic steps on its surface, wherein the substrate surface has a polarity at least at an edge of each atomic step; and
depositing linear elements onto the substrate such that each linear element is oriented to extend along one of the atomic steps on the substrate surface, with the result that a microstructure in which the linear elements extend along the atomic steps is formed on the substrate.

2. The method according to claim 1, wherein said depositing linear elements on the substrate is executed by depositing, onto the substrate, unit elements that can be associated with each other to form the linear elements.

3. The method according to claim 1, wherein each of the linear elements has a uniform polarity.

4. The method according to claim 1, wherein each of the atomic steps is one of a plurality of linear atomic steps that are parallel to each other.

5. A method for manufacturing a microstructure on a surface of a substrate, the method comprising:
preparing a substrate having atomic steps on its surface, wherein the substrate surface has a polarity at least at an edge of each atomic step;
depositing linear elements onto the substrate such that each linear element is oriented to extend along one of the atomic steps on the substrate surface;
performing ion irradiation of the substrate, on which the linear elements are oriented, thereby generating a lattice defect layer on the surface of the substrate, wherein the thickness of the lattice defect layer generated by the ion irradiation is less in a first portion of the substrate surface that is masked by the linear elements than in a second portion of the substrate surface that is not masked by the linear elements; and
polishing the substrate surface after the ion irradiation to remove the lattice defect layer generated on the substrate surface through the ion irradiation, wherein, due to the difference in the thickness of the lattice defect layer between the first portion and the second portion of the substrate surface, a microstructure of protrusion lines corresponding to the first portion and recess lines corresponding to the second portion is formed on the substrate surface after the polishing.

6. The method according to claim 5, wherein said depositing linear elements on the substrate is executed by depositing, onto the substrate, unit elements that can be associated with each other to form the linear elements.

7. The method according to claim 5, wherein each of the linear elements has a uniform polarity.

8. The method according to claim 5, wherein each of the atomic steps is one of a plurality of linear atomic steps that are parallel to each other.

9. The method according to claim 5, wherein the width of the protrusion lines is 2 to 20 nm, and the protrusion lines are repetitively formed over the entirety of a square area each side of which is at least 1 μm long.

10. The method according to claim 1, wherein the substrate is made of silicon carbide, sapphire, or zinc oxide.

11. The method according to claim 1, wherein the substrate is made of silicon carbide.

12. The method according to claim 5, wherein the substrate is made of silicon carbide, sapphire, or zinc oxide.

13. The method according to claim 5, wherein the substrate is made of silicon carbide.

* * * * *